(12) United States Patent
Griffin et al.

(10) Patent No.: US 8,753,974 B2
(45) Date of Patent: Jun. 17, 2014

(54) CHARGE DISSIPATION OF CAVITIES

(75) Inventors: Brian Griffin, Boise, ID (US); Russ Benson, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 1268 days.

(21) Appl. No.: 11/765,768

(22) Filed: Jun. 20, 2007

(65) Prior Publication Data

US 2008/0318419 A1  Dec. 25, 2008

(51) Int. Cl.
*H01L 21/4763* (2006.01)

(52) U.S. Cl.
USPC ........... 438/633; 438/634; 438/635; 438/636; 438/637; 438/638; 438/639; 438/640; 438/717; 438/734; 438/736; 438/739; 438/940

(58) Field of Classification Search
None
See application file for complete search history.

(56) References Cited

U.S. PATENT DOCUMENTS

| | | | |
|---|---|---|---|
| 5,308,722 A * | 5/1994 | Nistler ............................... | 430/5 |
| 5,760,535 A * | 6/1998 | Moyer et al. ................... | 313/309 |
| 5,847,407 A * | 12/1998 | Lucero et al. .................... | 257/10 |
| 5,888,906 A | 3/1999 | Sandhu et al. | |
| 5,985,767 A | 11/1999 | Roberts et al. | |
| 5,997,699 A | 12/1999 | Leiphart | |
| 6,365,507 B1 | 4/2002 | Hu | |
| 6,406,998 B1 | 6/2002 | Prall et al. | |
| 6,426,301 B1 * | 7/2002 | Shields et al. ................ | 438/706 |
| 6,489,710 B1 * | 12/2002 | Okita et al. .................... | 313/309 |
| 6,613,666 B2 * | 9/2003 | Ma ................................. | 438/637 |
| 6,727,047 B2 * | 4/2004 | Montgomery et al. ........ | 430/322 |
| 6,730,609 B2 * | 5/2004 | Howard et al. ............... | 438/706 |
| 6,764,901 B2 | 7/2004 | Noble et al. | |
| 6,812,145 B2 * | 11/2004 | Ma ................................ | 438/653 |
| 6,812,150 B2 | 11/2004 | Zheng | |
| 6,852,454 B2 * | 2/2005 | Mancini et al. .................... | 430/5 |
| 6,852,640 B2 * | 2/2005 | Gutsche ......................... | 438/719 |
| 6,890,688 B2 * | 5/2005 | Mancini et al. .................... | 430/5 |
| 6,890,812 B2 | 5/2005 | Forbes et al. | |
| 6,924,228 B2 * | 8/2005 | Kim et al. ...................... | 438/636 |
| 6,967,136 B2 * | 11/2005 | Akatsu et al. ................. | 438/243 |
| 6,969,569 B2 * | 11/2005 | Montgomery et al. ........... | 430/5 |
| 7,052,617 B2 * | 5/2006 | Huang et al. ...................... | 216/2 |
| 7,135,256 B2 * | 11/2006 | Montgomery et al. ........... | 430/5 |
| 7,351,648 B2 * | 4/2008 | Furukawa et al. ............. | 438/597 |
| 7,517,710 B2 * | 4/2009 | Choi et al. ....................... | 438/34 |
| 7,713,430 B2 * | 5/2010 | Wilson ............................ | 216/59 |
| 2001/0044077 A1 * | 11/2001 | Tan ................................ | 430/315 |
| 2002/0071995 A1 * | 6/2002 | Montgomery et al. ........... | 430/5 |
| 2003/0109131 A1 * | 6/2003 | Ma ................................. | 438/637 |
| 2003/0113638 A1 * | 6/2003 | Mancini et al. .................... | 430/5 |
| 2003/0133638 A1 * | 7/2003 | Jin et al. ........................... | 385/2 |
| 2003/0216036 A1 * | 11/2003 | Ma ................................. | 438/637 |
| 2003/0232252 A1 * | 12/2003 | Mancini et al. .................... | 430/5 |
| 2004/0265706 A1 * | 12/2004 | Montgomery et al. ........... | 430/5 |
| 2005/0029922 A1 * | 2/2005 | Taniguchi et al. ............. | 313/495 |
| 2005/0212077 A1 * | 9/2005 | Choi et al. ..................... | 257/510 |
| 2007/0049018 A1 | 3/2007 | Sandhu et al. | |
| 2007/0091961 A1 * | 4/2007 | Lin et al. .................. | 372/50.124 |
| 2007/0264820 A1 * | 11/2007 | Liu et al. ...................... | 438/624 |
| 2008/0318419 A1 * | 12/2008 | Griffin et al. ................. | 438/666 |
| 2009/0229856 A1 * | 9/2009 | Fredenberg et al. ....... | 174/126.2 |

* cited by examiner

*Primary Examiner* — David E Graybill
(74) *Attorney, Agent, or Firm* — Wells St. John P.S.

(57) ABSTRACT

Structures and methods for the dissipation of charge build-up during the formation of cavities in semiconductor substrates.

5 Claims, 13 Drawing Sheets

CHARGE DISSIPATION OF CAVITIES

BACKGROUND

The present invention relates generally to the dissipation of charge build-up along cavities within integrated circuits during etching. More particularly, the present invention relates to methods of dissipating the charge build-up along cavities within integrated circuits and the structure of an integrated circuit that can be used to dissipate the charge build-up.

Successful construction of nano- and microstructures requires reliable and reproducible methods of production. One such nano- or microstructure is a contact hole or trench (i.e., a cavity). Contact hole structures are generally fabricated using wet (crystal anisotrophy) or dry plasma (ion-bombardment anisotrophy) etching. One example of a contact hole formed by dry plasma etching is shaped by etching through an oxide material overlaying a silicon substrate using a hard photoresist mask deposited on top of the oxide material, wherein the etching substantially stops on the underlying substrate. Contact holes have a diameter, also known as width, and a depth. The diameter is referred to as the feature size and tends to decrease with increasing circuit density. The aspect ratio is the ratio of depth to width and tends to increase as the width decreases and depth increases. Modern integrated circuits are scaled with increasingly narrower design rules. In addition, as the width of the etched features decreases, the aspect ratio increases, necessitating a high aspect ratio etch process.

One such high aspect ratio etch process is reactive ion etching. Reactive ion etching is a process whereby a low pressure gas is subjected to a radio frequency electric field in a reaction chamber to form a plasma. A plasma is a gas which contains positive, negative, and neutral atoms, and/or molecules including radicals and a "gas" of emitted photons. The ions and radicals in the plasma that form the etchants are accelerated by an electric field against the material to be etched. The ions/radicals interact with the surface of the atoms or molecules within the material to be etched, forming a volatile by-product which is subsequently removed from the reaction chamber.

If a chemically inert gas, such as argon, is ionized and accelerated to impinge on a substrate surface, material can be removed from the surface of the substrate by momentum transfer, a process similar to sand blasting. This process is used in three distinct modes: sputter etching, ion-beam milling and focused ion beam etching. Sputter etching and broad-ion beam milling use high-energy, inert gas ions (typically $Ar^+$) to dislodge material from the substrate surface, a highly anisotropic etch process. Anisotropic etching may occur when the etch rate is considerably greater in one direction then in another (also known as unidirectional etching). Isotropic etching may refer to etching in all directions at a relatively even rate.

The ion bombardment in reactive ion etching can also result in a charge build-up on cavity surfaces, resulting in damage to the underlying film and semiconductor surface exposed to ion bombardment. For example, the bottom of the contact hole may charge positively while other surfaces charge negatively, thereby creating undesired local electric fields on the mask surface and/or within the contact hole. These local electric fields may deflect the incoming ions causing changes in the trajectory of those ions. This, in turn, results in the contact hole "twisting" during its formation and becoming non-vertical. Further, sidewall charging may also lead to complete etch stoppage in high aspect ratio contact holes. Another related issue associated with the charge build-up along the surfaces is that the contact hole may miss the active area landing region in the underlying substrate due to the twisting of the contact hole during its formation. Therefore, it is important to produce vertically straight contact holes because straight sidewall profiles ensure that the subsequently deposited metal material can properly fill the etched feature and make suitable electrical contact with the active area landing region.

As used herein, "semiconductor substrate" refers to either a base semiconductor (e.g., the lowest layer of a silicon material in a wafer, or a silicon layer deposited on another material, such as silicon on sapphire) or a partially-fabricated integrated circuit having one or more layers or structures formed thereon or regions formed therein. When reference is made to a semiconductor substrate in the following description, various process steps may have been previously used to form or define regions, junctions, or various structures or features and cavities, such as vias, contact openings, high aspect ratio openings, etc., within or on the semiconductor substrate.

FIG. 1 is a cross-sectional view of one example of a semiconductor substrate 10 that has a "twisted" contact hole resulting from charge build-up. A non-vertical contact hole 14 can create many problems. FIG. 2A illustrates one such problem associated with contact hole 14 twisting. The twisted contact hole 14 depicted in FIG. 2A makes only partial contact with the active area landing region 20, resulting in an imperfect contact between subsequently deposited conductive metal within the contact hole 14 and the active area landing region 20. FIG. 2B illustrates one preferred alignment of the contact hole 14 with the active area landing region 20 in which there is no twisting of the contact hole 14 ensuring that the subsequently deposited conductive metal makes suitable contact with the active area landing region 20. FIG. 2C illustrates a contact hole 14 that is so twisted that it completely misses the active area landing region 20 and no contact is made between the contact hole 14 and the active area landing region 20, resulting in the failure of subsequently deposited conductive metal to make a suitable contact with the active area landing region 20.

FIG. 3 provides another view of the potential problems associated with contact hole twisting. FIG. 3 is an overhead view of a semiconductor substrate 15 showing active area 22 and the importance of etching substantially vertical contact holes 16. When there is proper alignment and limited or no twisting of the contact hole 16, the contact holes 16 are positioned within the active area 22. However, when twisting occurs, the contact holes 18 may twist away from the active area 22 and fall outside of the active area 22. These contact holes 18 do not make contact with the active area 22 when the contact holes 18 are filled with conductive metal.

Although FIGS. 1-3 illustrate the problem of twisting in relation to contact holes, twisting can potentially affect any cavity formed using a variety of semiconductor manufacturing processes. For example, the cavity could be a trench, a via, etc.

DETAILED DESCRIPTION

Figure 1:
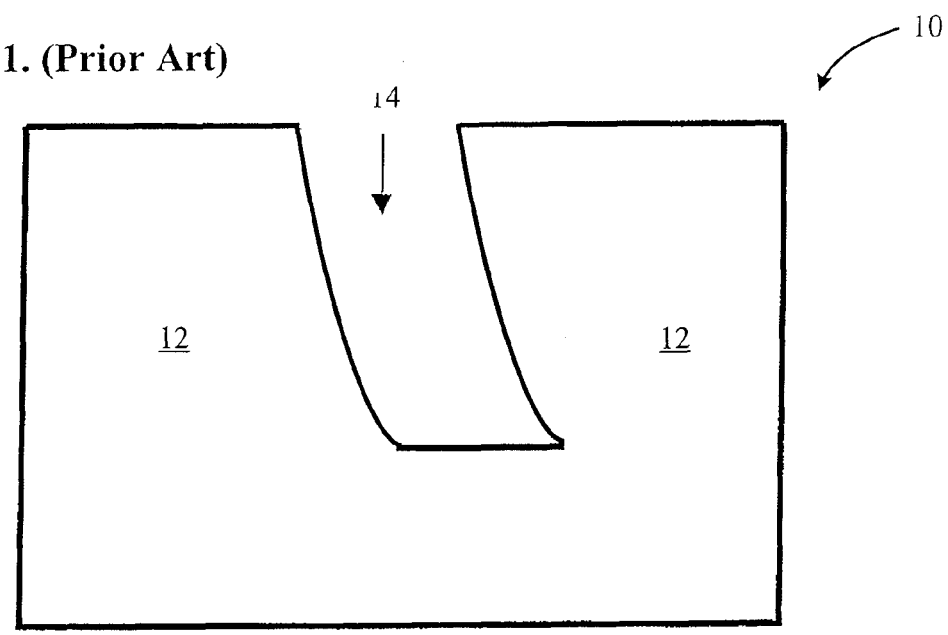
FIG. 1 is a cross-sectional view of a semiconductor substrate that has a twisted contact hole.
Figure 2:
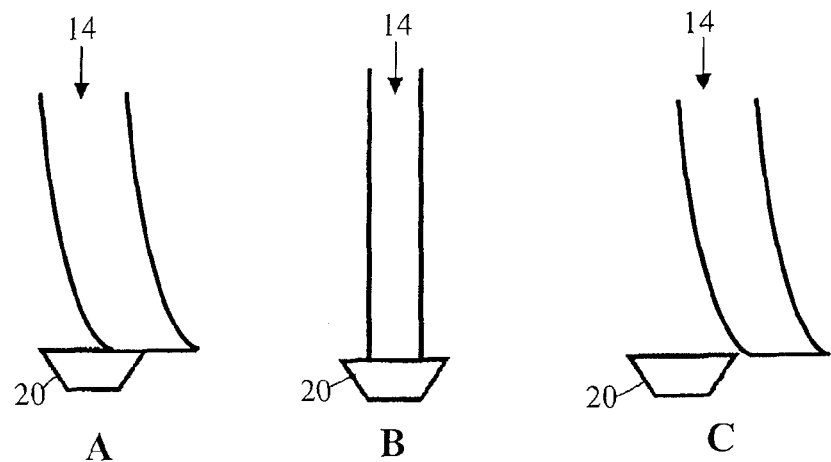
FIGS. 2A, 2B, and 2C are cross-sectional views of possible contact hole misalignments with the active area landing regions as may result from the twisting of the contact holes.
Figure 3:
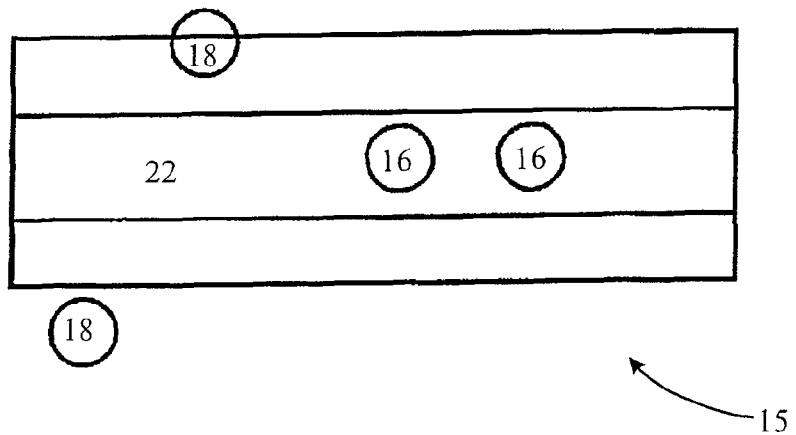
FIG. 3 is an overhead view of possible contact hole misalignments with the active area as may result from the twisting of the contact holes.

In the following detailed description of some illustrative embodiments of the invention, reference is made to the accompanying figures of the drawing which form a part hereof, and in which are shown, by way of illustration, specific embodiments in which the invention may be practiced. It is to be understood that other embodiments may be utilized and structural changes may be made without departing from the scope of the present invention. Unless stated otherwise herein, the figures of the drawing are rendered primarily for clarity and, thus, may not be drawn to scale.

As used herein, "a," "an," "the," "at least one," and "one or more" are used interchangeably. The term "and/or" (if used) means one or all of the listed elements or a combination of any two or more of the listed elements.

Figure 4:
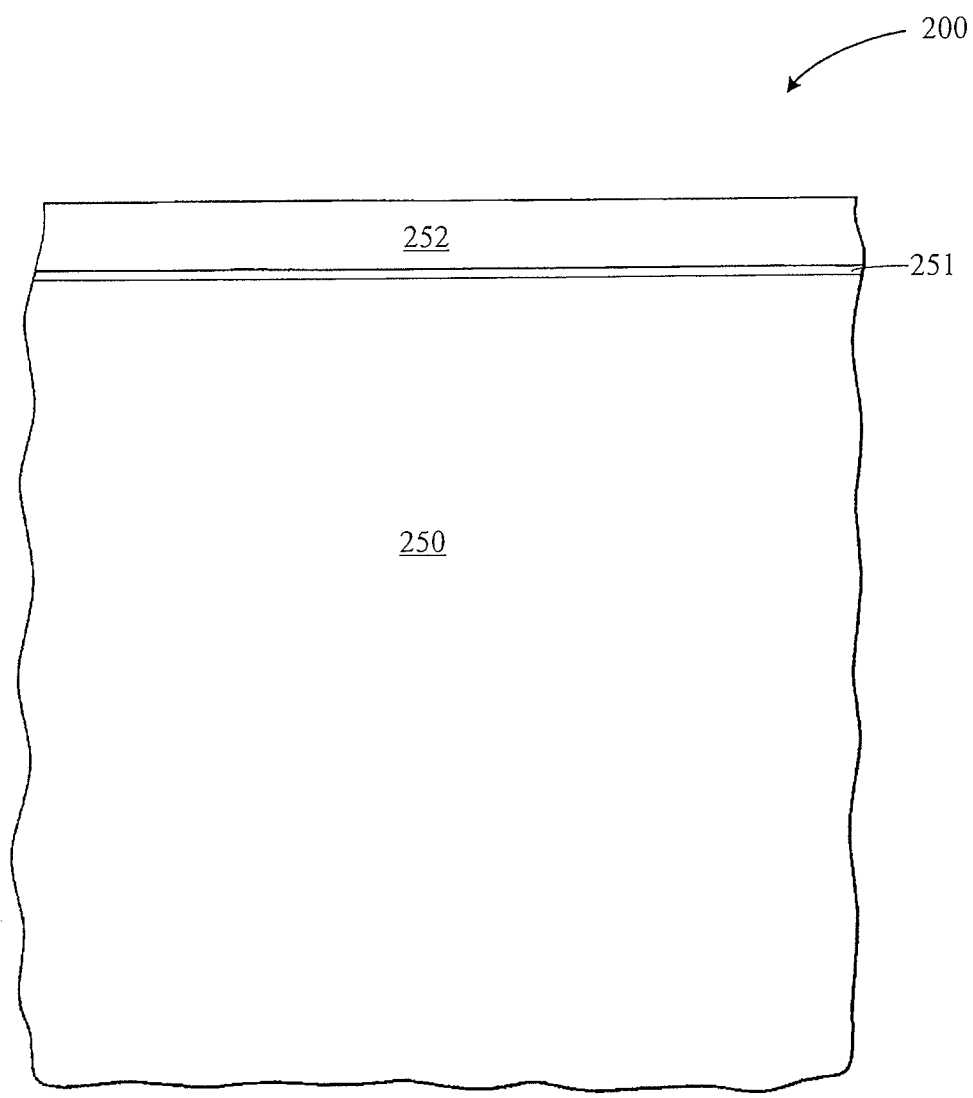
FIG. 4 is an expanded cross-sectional view of an integrated circuit according to one embodiment of the present invention.

FIG. 4 illustrates an enlarged cross-sectional view of one example of an integrated circuit device 200. Integrated circuit device 200 includes a semiconductor substrate 250 that includes an optional etch-stop (e.g., a nitride material, etc.) 251.

Dissipation material 252 is deposited on the optional etch-stop 251 of the semiconductor substrate 250. As used herein, "deposited" (and variations thereof) includes any technique by which the dissipation material may be provided on the semiconductor substrate 250). The dissipation material 252 may include conductive material therein. The conductive material may, in some embodiments, be a metallic material, where "metallic material" can be a metal or metal-containing compound. In some embodiments, the dissipation material 252 may consist essentially of metallic material. Examples of some potentially suitable metallic materials that may be used for the dissipation material include: titanium, titanium nitride, tungsten, aluminum, gold, platinum, etc. and combinations thereof.

The thickness of the dissipation material 252 on the semiconductor substrate 250 (including depicted optional etch stop 251) may vary depending on the application. For example, the dissipation material 252 may be about 50 angstroms to about 2000 angstroms thick. The thickness of the dissipation material 252 may vary depending on many factors including, but not limited to, the conductive material used in the dissipation material, the aspect ratio of the cavity to be formed in the semiconductor substrate, pressure, temperature, RF power, hardness, and/or inert gas type, etc.

Figure 5:
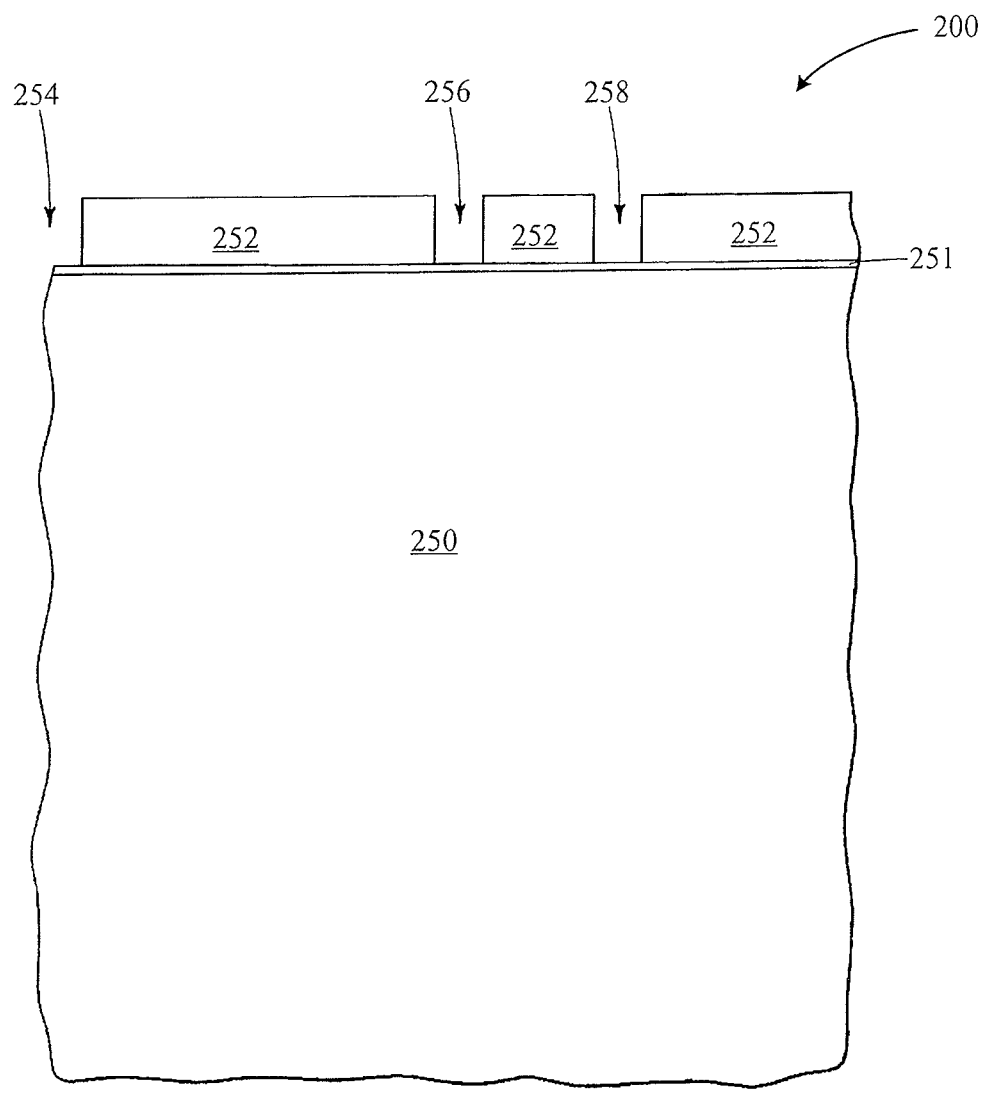
FIG. 5 is an expanded cross-sectional view of the integrated circuit shown in FIG. 4 at a successive processing stage in accordance with the present invention.

FIG. 5 illustrates an enlarged cross-sectional view of the integrated circuit device 200 as shown in FIG. 4 after removing portions of the dissipation material 252 to form cavities 254, 256, and 258.

In the depicted embodiment, cavities 254, 256, and 258 are formed through the dissipation material 252 and stop at the optional etch-stop 251 of the semiconductor substrate 250. The cavities 254, 256, and 258 may be contact holes, trenches, and/or any other cavity as would be known by one skilled in the art.

The cavities 254, 256, and 258 may be formed through the dissipation material 252 by any semiconductor fabrication process as would be known by one skilled in the art, such as a plasma etch, reactive ion etch, inductively coupled plasma (ICP) etch, microwave etch, etc. One example of a suitable process when the dissipation material 252 is titanium with a thickness of about 200 angstroms may be an ICP process that uses HBr (flowed at about 0 standard cubic centimeters per minute (sccm) to about 100 sccm), $Cl_2$ (flowed at about 50 sccm to about 150 sccm), He (flowed at about 0 sccm to about 100 sccm) and $O_2$ (flowed at about 0 sccm to about 10 sccm) conducted under a pressure of about 5 millitorr to about 20 millitorr, utilizing a plasma power of about 300 watts to about 500 watts at about 2 megahertz to about 60 megahertz, and a substrate bias of about 100 watts to about 200 watts at about 2 megahertz to about 60 megahertz.

In the depicted embodiment, the etching may substantially stop upon reaching optional etch-stop 251. Subsequently, the etch-stop 251 exposed within cavities 254, 256, and 258 formed through the dissipation material 252 may be removed through the use of any suitable semiconductor fabrication process, such as, for example, reactive ion etch, inductively coupled plasma etch, microwave etch, etc.

Figure 6:
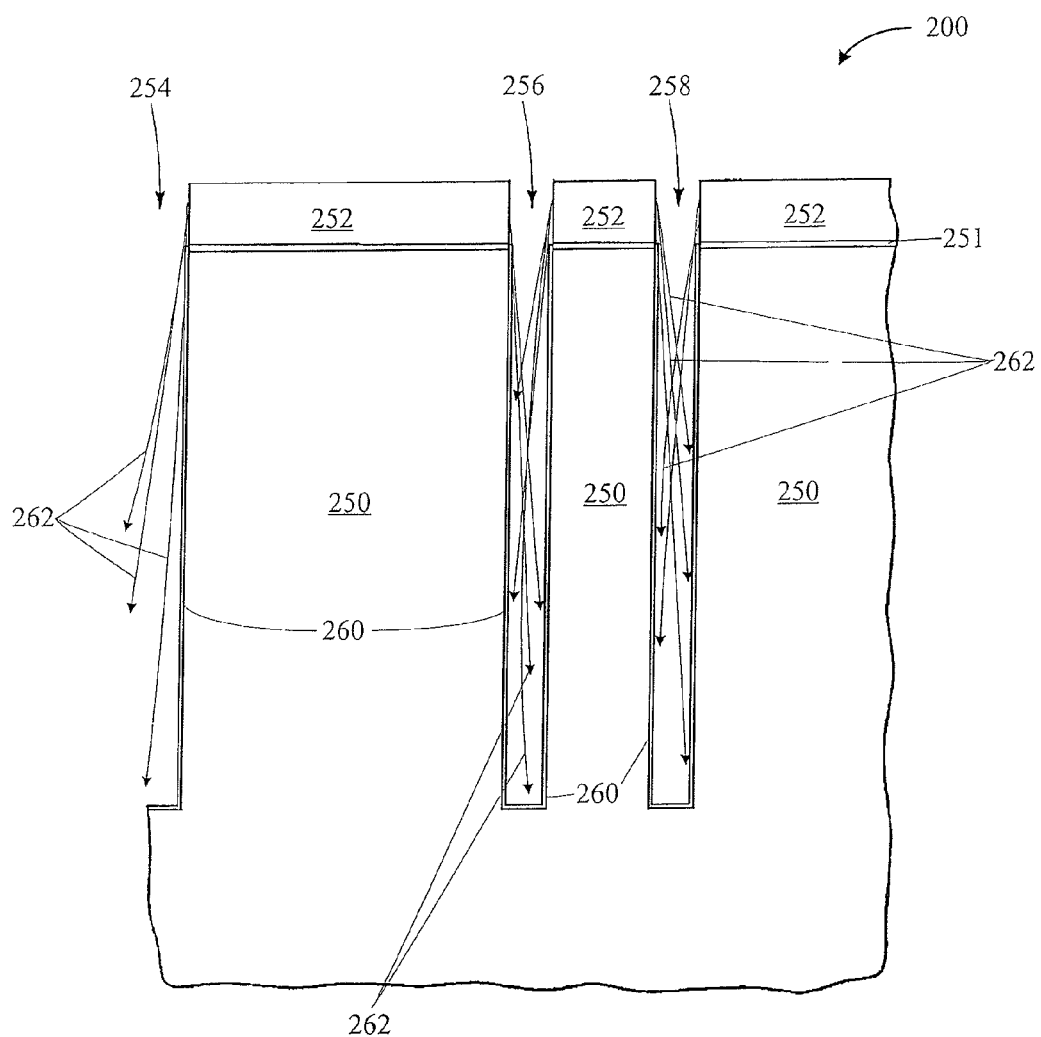
FIG. 6 is an expanded cross-sectional view of the integrated circuit shown in FIG. 4 at a successive processing stage in accordance with the present invention.

FIG. 6 illustrates an expanded cross-sectional view of the integrated circuit device 200 as shown in FIG. 5 after removing portions of semiconductor substrate 250 and transferring (e.g., depositing, contacting, etc.) portions of the dissipation material 252.

Cavities 254, 256, and 258 are extended into the semiconductor substrate 250. The etch may substantially stop upon reaching a predetermined depth in the semiconductor substrate 250. In one embodiment, the etching may substantially stop upon reaching another etch-stop that is located proximate the bottom of the semiconductor substrate 250. Subsequently, the etch-stop located proximate the bottom of the cavities may be removed through the use of any suitable semiconductor fabrication process, e.g., a plasma etch, reactive ion etch, inductively coupled plasma etch, microwave etch, etc.

The cavities 254, 256, and 258 may be formed through the semiconductor substrate 250 by any suitable semiconductor fabrication process, e.g., a plasma etch, reactive ion etch, inductively coupled plasma etch, microwave etch, etc.

In some embodiments, the same process used to remove the etch stop 251 may be used to extend the cavities 254, 256, and 258 into the semiconductor substrate 250. Alternatively, the etch stop 251 may be removed in a process (e.g., etch process, etc.) that is different (e.g., separate and distinct) from the process used to extend the cavities 254, 256, and 258 into the semiconductor substrate 250. For example, dissipation materials 252 formed of different materials may require different etch processes, which, in turn may be different etch processes than those needed to extend the cavities 254, 256, and 258 into the semiconductor substrate 250.

As discussed herein, aspect ratio can be defined as the ratio of depth to width of a cavity (i.e., depth:width). The cavities 254, 256, and 258 formed within the integrated circuit device 200 may have high aspect ratios, such as from about 20:1 or higher to about 40:1 or higher. However, the cavities may alternatively have aspect ratios as low as from about 1:1 or higher. The cavities 254, 256, and 258 may, e.g., have a depth of about 10,000 angstroms to about 40,000 angstroms. The cavities 254, 256, and 258 may, e.g., have a width of about 250 angstroms to about 1,000 angstroms.

Although the cavities 254, 256, and 258 are depicted with approximately parallel sidewalls, the sidewalls may alternatively be tapered, bowed, and/or take any other suitable relationship. Further, although the surfaces (e.g., sidewalls or bottom surfaces) of cavities 254, 256, and 258 are depicted as flat, they may take any suitable shape.

Figure 7:
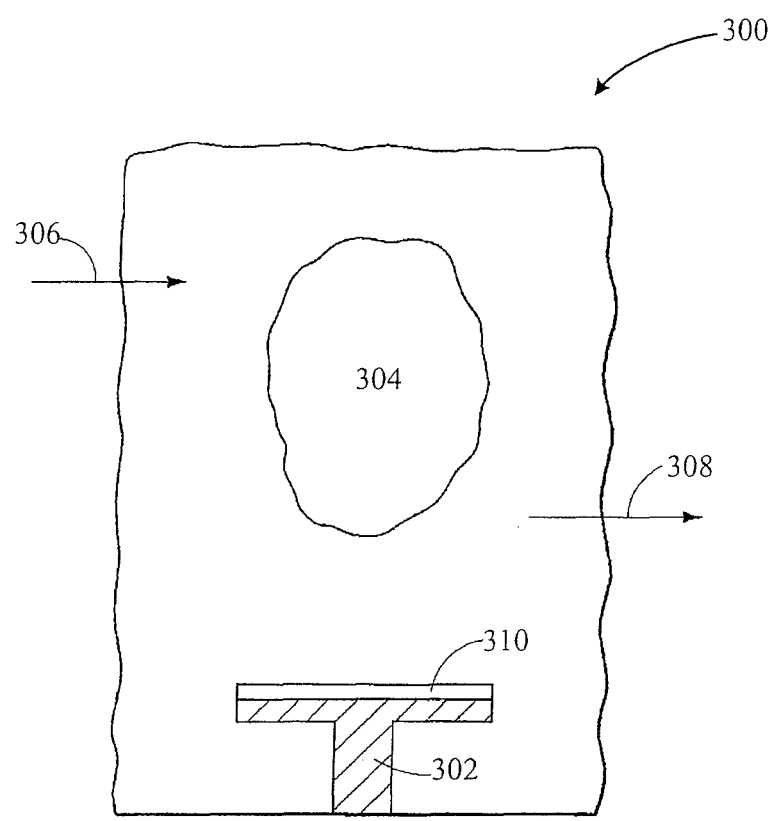
FIG. 7 is a perspective view of an etch chamber in accordance with the present invention.

The etching may be conducted in an etching chamber, such as the chamber 300 diagrammatically illustrated in FIG. 7. The chamber 300 may have a substrate holder 302 provided therein that retains a semiconductor substrate 310 (e.g., an integrated circuit device 200 or a semiconductor substrate 250 as shown in FIG. 4). The chamber 300 has a region above the substrate 310 within which a plasma 304 is maintained. Etching components are flowed into the chamber as diagrammatically illustrated by arrow 306, and products and unreacted etching components are flowed out of the chamber 300 as diagrammatically illustrated by arrow 308. There may be a flow of materials through the etching chamber 300 during an etching process. The materials within the etching chamber 300 during the etching process may be referred to as an etching ambient. The materials within the etching chamber 300 may be in a gas or plasma state and may be referred to as an etching fluid. The processes as described herein may be performed without removing the semiconductor substrate 310 from the chamber 300 until the processes are complete (i.e., in situ).

Referring again to FIG. 6, the etch used to form/extend the cavities 254, 256, and 258 into the semiconductor substrate 250 may use $C_4F_8$ (flowed at about 10 standard cubic centimeters per minute (sccm) to about 100 sccm), argon (flowed at about 200 sccm to about 2,000 sccm), oxygen (flowed at about 10 sccm to about 50 sccm) and $C_4F_6$ (flowed at about 10 sccm to about 100) conducted under a pressure of about 10 millitorr to about 60 millitorr, utilizing a plasma power of about 1,000 watts to about 3,000 watts at about 27 megahertz to about 60 megahertz, and a substrate bias of about 2,000 watts to about 6,000 watts at about 200 kilohertz to about 13.56 megahertz. Other etches may alternatively be used in place of this etch.

In another embodiment, the etch used to form/extend the cavities 254, 256, and 258 may utilize $C_4F_8$ (flowed at about 60 sccm), argon (flowed at about 1100 sccm), oxygen (flowed at about 25 sccm) and $C_4F_6$ (flowed at about 2 sccm) conducted under a pressure of about 30 millitorr, utilizing a plasma power of about 2100 watts at about 60 megahertz, and a substrate bias of about 3500 watts at about 2 megahertz.

The source gases (also know as an etching ambient) used in the etching of the semiconductor substrate 250 may be any suitable hydrocarbon fluoride such as, for example, $CH_2F_2$; $C_4F_8$; $C_4F_6$; $CHF_3$; $C_2F_6$, $C_2HF_5$; $CH_3F$; or $C_3H_3F_5$, $C_4F_8$ that has been mixed with oxygen gas.

As discussed herein, etching cavities into the semiconductor substrate 250 may cause excessive electric charges to build-up along the surfaces of the cavities. To address the charge build-up, portions of the dissipation material 252 may be dislodged and sputtered down into the cavities 254, 256, and 258 as part of the process of forming the cavities. The dislodged portions 262 (represented by the arrows 262 in FIG. 6) of the dissipation material 252 may be transferred (e.g., sputtered, etc.) to the interior surfaces (e.g., the sidewall (s), bottom, etc.) of the cavities 254, 256, and 258. The dislodged portions 262 may be transferred to the opposing side of the interior surfaces from which the portions 262 were sputtered (as depicted by the arrows in FIG. 6). Alternatively, some or all of the dislodged portions 262 may come to rest on any other interior surface of the cavities. The arrows depicted in FIG. 6 illustrate only some potential trajectories of the dislodged portions 262. The dislodged portions 262 may take any other trajectory or trajectories (e.g., straight-line, parabolic, sinusoidal, spiral, random, etc.).

The transferred portions of the dissipation material 252 may form as transferred dissipation material 260 along the interior surfaces of the cavities 254, 256, and 258. The transferred dissipation material 260 may cover all of one or more of the interior surfaces of the cavities 254, 256, and 258 or it may cover only a portion or portions of the interior surfaces. Further, the transferred dissipation material 260 may have a uniform (shown) or variable thickness. For example, the transferred dissipation material 260 may be about 1 angstrom to about 10 angstroms thick. The transferred dissipation material 260 may extend to the bottom surface of the cavities 254, 256, and 258 or the portions 262 may extend only partially down the sidewalls (depth) of the cavities 254, 256, and 258.

The dislodged portions 262 of the dissipation material may be dislodged from the dissipation material 252 (and transferred into the cavities 254, 256, and 258) using a single continuous process in which the dissipation material 252 is removed and the cavities 254, 256, and 258 are formed in the semiconductor substrate 250 (in those embodiments in which, for example, an etch stop 251 is not present). In another embodiment in which an etch stop 251 is present and the process used to form cavities 254, 256, and 258 in the dissipation material 252 is halted at etch stop 251, it may be possible to use the same process to both remove the etch stop 251 and extend the cavities 254, 256, and 258 into the semiconductor substrate 250. In still another embodiment, the same process used to form cavities 254, 256, and 258 through the dissipation material 252 can be used to extend the cavities 254, 256, and 258 into the semiconductor substrate 250 if a different process is used to remove the intervening etch stop 251. In yet another embodiment, three different processes may be used to form the cavities 254, 256, and 258 in the dissipation material 252, remove the etch stop 251, and extend the cavities 254, 256, and 258 into the semiconductor substrate 250.

The dissipation material 252 may contain conductive material as described herein with reference to FIG. 4. As such, the portions 262 of the dissipation material 252 that are dislodged and transferred into the cavities 254, 256, and 258 to form transferred dissipation material 260 may include conductive material that forms conductive paths for charge dissipation. Those conductive paths may bleed-off or dissipate electrical charges in the cavities 254, 256, and 258. By bleeding-off or discharging electric charges in the cavities, the incoming etching ions may not be deflected during the etching process (due to no or limited charge build-up), and, in turn, the sidewalls of the cavities may be formed substantially vertical (i.e., no or reduced twisting should occur).

Figure 8:
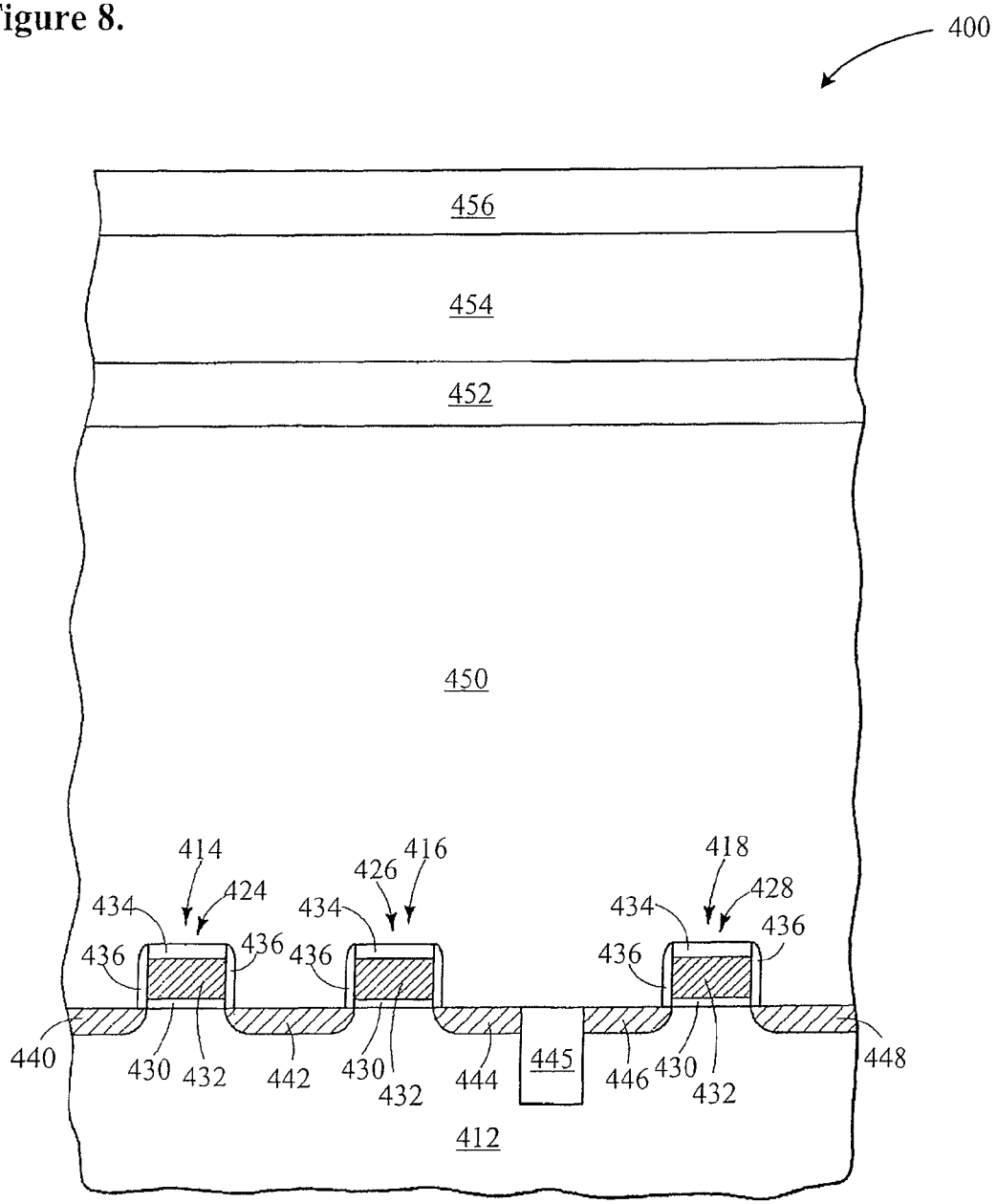
FIG. 8 is an expanded cross-sectional view of another integrated circuit according to one embodiment of the present invention

FIG. 8 illustrates an expanded cross-sectional view of another embodiment of an integrated circuit device 400 (e.g., a portion of a dynamic random access memory array). Although this embodiment may be formed using the methods described herein with reference to a portion of a dynamic random access memory array, the methods may be used for any type of semiconductor device fabrication.

Integrated circuit device 400 includes a base semiconductor material 412 having a plurality of transistors 414, 416, and 418 supported thereby. The base semiconductor material 412 may include any suitable semiconductor composition or combination of compositions as would be known to one skilled in the art. For example, the base semiconductor material 412 may contain monocrystalline silicon doped with an appropriate dopant. Further, the base semiconductor material 412 may be a portion of a monocrystalline silicon wafer. The base semiconductor material 412 may be considered to be a semiconductor substrate, or a portion of a semiconductor substrate.

Transistors 414, 416, and 418 include gates 424, 426, and 428, respectively. Gates 424, 426, and 428 include stacks containing gate dielectric 430, electrically conductive gate material 432, and an electrically insulative cap 434. The electrically conductive gate material 432 may include one or more of metal (e.g., titanium or tungsten), metal compounds (e.g., metal silicide or metal nitride), conductively-doped semiconductor material (e.g., conductively-doped silicon), etc. The gate dielectric 430 may include silicon dioxide. The insulative caps 434 may include one or more of silicon nitride, silicon dioxide, silicon oxynitride, etc.

Electrically insulative sidewall spacers 436 are located along sidewalls of the gates 424, 426, and 428. Such sidewall spacers 436 may include one or more of silicon dioxide, silicon nitride, silicon oxynitride, etc.

Transistors 414, 416, and 418 include source/drain regions 440, 442, 444, 446, and 448. Transistors 414 and 416 are paired, and share a common source/drain region 442. Transistor 418 may be part of another paired transistor set, so that source/drain region 448 is also a shared source/drain region. Source/drain regions 444 and 446 are electrically isolated from one another by an isolation region 445 provided between them. The isolation region 445 is filled with insulative material, such as, for example, one or both of silicon dioxide and silicon nitride; and may correspond to a shallow trench isolation region.

Ultimately, shared source/drain regions 442 and 448 may be connected to bit lines, and the remaining source/drain regions 440, 444, and 446 may be connected to capacitors. Accordingly, transistors 414, 416, and 418 may be incorporated into a dynamic random access memory (DRAM) array formed from integrated circuit device 400.

A silicon oxide-containing material 450 is located adjacent to at least a portion of transistors 414, 416, and 418. The silicon oxide-containing material 450 may include a single homogeneous mass, as shown, or it may include multiple materials. For example, the silicon oxide-containing material 450 may include a first nitride portion formed adjacent to a silicon oxide portion and a second nitride portion beneath the silicon oxide portion (not shown). These nitride portions may be utilized as etch stops. The thickness of the nitride portions may vary depending on the application as would be known by one skilled in the art. The nitride portions may be, e.g., about 100 angstroms to about 400 angstroms thick.

Also, for example, a majority of the silicon oxide-containing material 450 may include silicon dioxide ($SiO_2$) or one or more doped oxides, such as phosphosilicate glass (PSG), borophosphosilicate glass (BPSG), fluorosilicate glass (FSG), tetraethylorthosilicate (TEOS), spin-on dielectric (SOD), etc. In some embodiments, an entirety of the silicon oxide-containing material 450 may include one or more doped oxides. In some embodiments, at least a portion of silicon oxide-containing material 450 may consist essentially of silicon dioxide. For instance, a lower portion of silicon oxide-containing material 450 may be a portion that consists essentially of silicon dioxide, and the remainder of silicon oxide-containing material 450 may be formed of one or more doped silicon oxides.

The thickness of the silicon oxide-containing material 450 may vary depending on the device 400 to be formed. The silicon oxide-containing material 450 may be, e.g., about 10,000 angstroms to about 40,000 angstroms thick. The thickness of the silicon oxide-containing material 450 may vary depending on many factors including, but not limited to, aspect ratio of the cavities to be formed therein, pressure, temperature, etc.

Dissipation material 452 is formed adjacent to at least a portion of the silicon oxide-containing material 450 as described herein with reference to dissipation material 252 of FIG. 4. Also, the dissipation material 452 may have, for example, the same physical characteristics as the dissipation material 252 as described herein with reference to FIG. 4.

The integrated circuit device 400 depicted in FIG. 8 also includes a hard mask 454 formed on the dissipation material 452. Hard mask 454 may be formed of transparent amorphous carbon or any other suitable material. The hard mask 454 may be transparent in the visible light range and may be formed with a thickness that does not substantially affect the reading of any alignment marks on the device to allow for the proper alignment and etching of the contact holes. The visible light range may include any light having a wavelength between about 400 nanometers and about 700 nanometers. The hard mask 454 may have a substantially low absorption coefficient of between about 0.15 and about 0.001 at a wavelength of 633 nanometers.

Hard mask 454 may be formed on the dissipation material 452 through the use of any suitable semiconductor fabrication process. For example, the hard mask 454 may be deposited using a plasma enhanced chemical vapor deposition chamber (PECVD). The temperature of the chamber may be set to range from about 200 degrees Celsius to about 500 degrees Celsius. A process gas including propylene ($C_3H_6$) may be introduced into the chamber at a flow rate of about 500 sccm to about 3000 sccm. An additional gas including helium may be introduced into the chamber at a rate of about 250 sccm to about 1000 sccm. At least one other hydrocarbon gas may be used in the process gas such as, for example $CH_4$, $C_2H_2$, $C_2H_4$, $C_2H_6$, and $C_3H_8$. Helium may also be used in combination with at least one these hydrocarbon gases. During the process, the chamber may be subjected to a radio frequency (RF) power and a pressure. The RF power may, e.g., be set between about 450 Watts and about 1000 Watts. The pressure may, e.g., range from about 4 Torr to about 6.5 Torr.

The integrated circuit device 400 depicted in FIG. 8 also includes a photoresist 456 formed adjacent to at least a portion of the hard mask 454 to be patterned, i.e., portions are removed to define cavities (e.g., cavities 254, 256, and 258 as illustrated in FIG. 5) for use in selective etching of the underlying materials.

Figure 9:
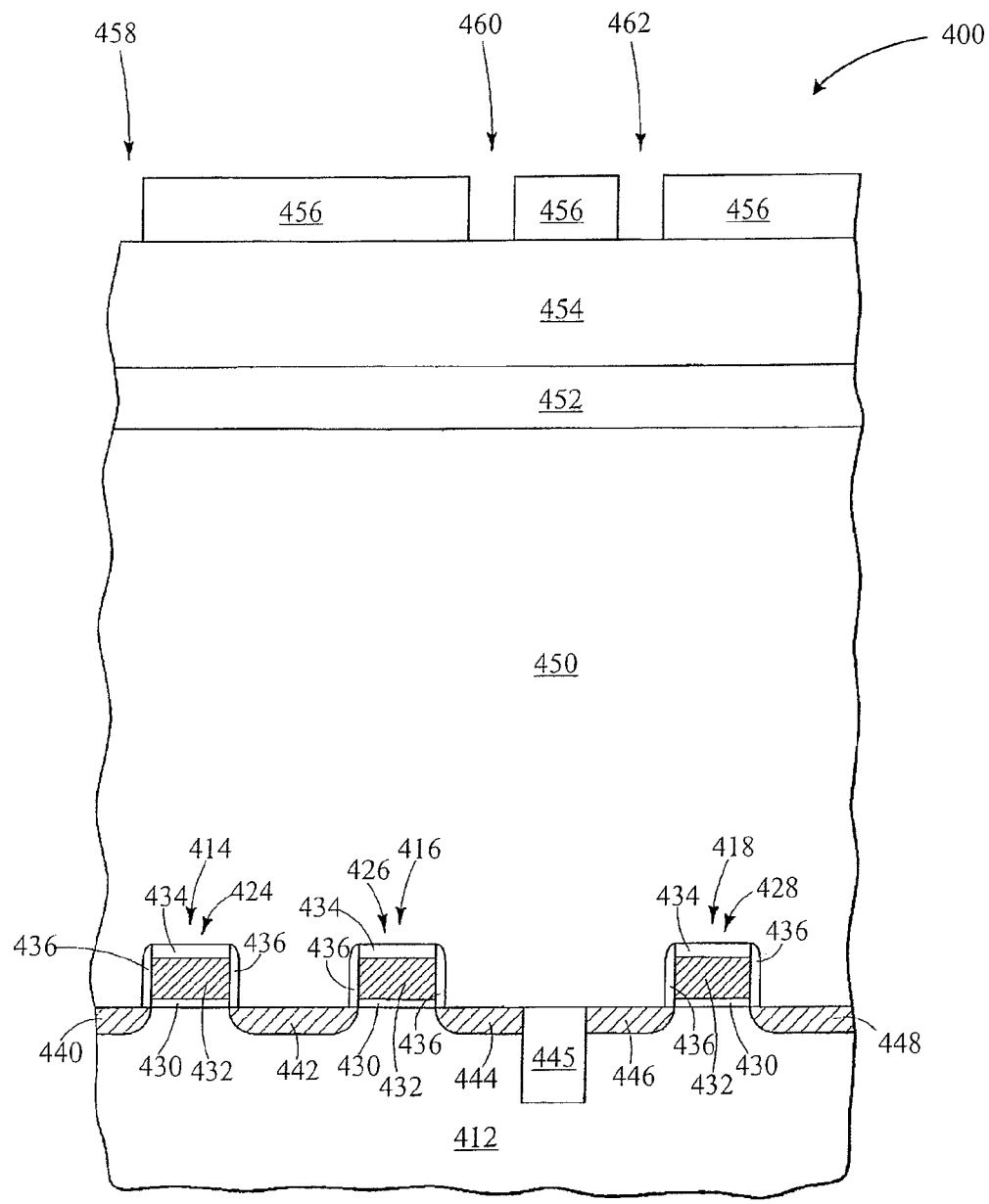
FIG. 9 is an expanded cross-sectional view of the integrated circuit shown in FIG. 8 at a successive processing stage in accordance with the present invention.

FIG. 9 illustrates an enlarged cross-sectional view of the integrated circuit device 400 as shown in FIG. 8 after patterning the photoresist 456 (i.e., removing portions of the photoresist 456) to forming cavities 458, 460, and 462 in the photoresist 456.

Figure 10:
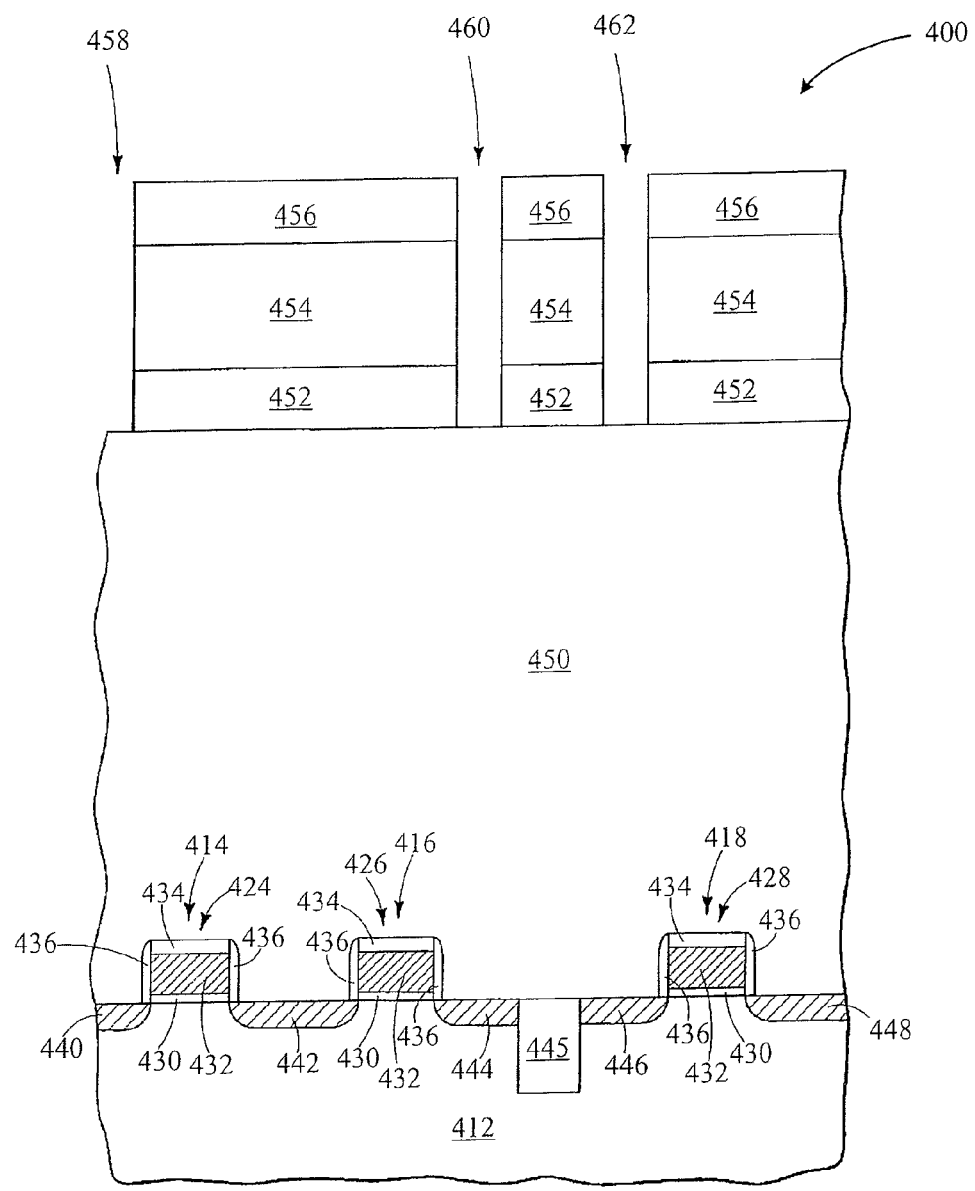
FIG. 10 is an expanded cross-sectional view of the integrated circuit shown in FIG. 8 at a successive processing stage in accordance with the present invention.

FIG. 10 illustrates an expanded cross-sectional view of the integrated circuit device 400 as shown in FIG. 9 after removing portions of the hard mask 454 and the dissipation material 452 to extend the cavities 458, 460, and 462 through the hard mask 454 and the dissipation material 452 towards the silicon oxide-containing material 450.

Hard mask 454 and the dissipation material 452 may be etched to form cavities 458, 460, and 462 by any suitable method that would be known to one skilled in the art. This etch may be substantially the same as the etch described herein with reference to FIG. 5 when etching the dissipation material 252. For example, the etch used to etch the dissipation material 452 may use HBr(flowed at about 0 standard cubic centimeters per minute (sccm) to about 100 sccm), $Cl_2$ (flowed at about 50 sccm to about 150 sccm), He (flowed at about 0 sccm to about 100 sccm) and $O_2$ (flowed at about 0 sccm to about 10 sccm) conducted under a pressure of about 5 millitorr to about 20 millitorr, utilizing a plasma power of about 300 watts to about 500 watts at about 2 megahertz to about 60 megahertz, and a substrate bias of about 100 watts to about 200 watts at about 2 megahertz to about 60 megahertz.

The etch that extends cavities 458, 460, and 462 through the hard mask 454 may be the same etch process used to form the cavities 458, 460, and 462 through the dissipation material 452, or it may be a completely separate and distinct etch process.

The progress of the etch may be stopped by using an etch-stop on the silicon oxide-containing material 450 (e.g., the etch-stop 251 described herein with reference to FIG. 4 may be used on silicon-oxide containing material 450). Subsequently, the etch-stop may be removed through the use of any suitable semiconductor fabrication process to allow extension of the cavities into the silicon oxide-containing material 450.

Figure 11:
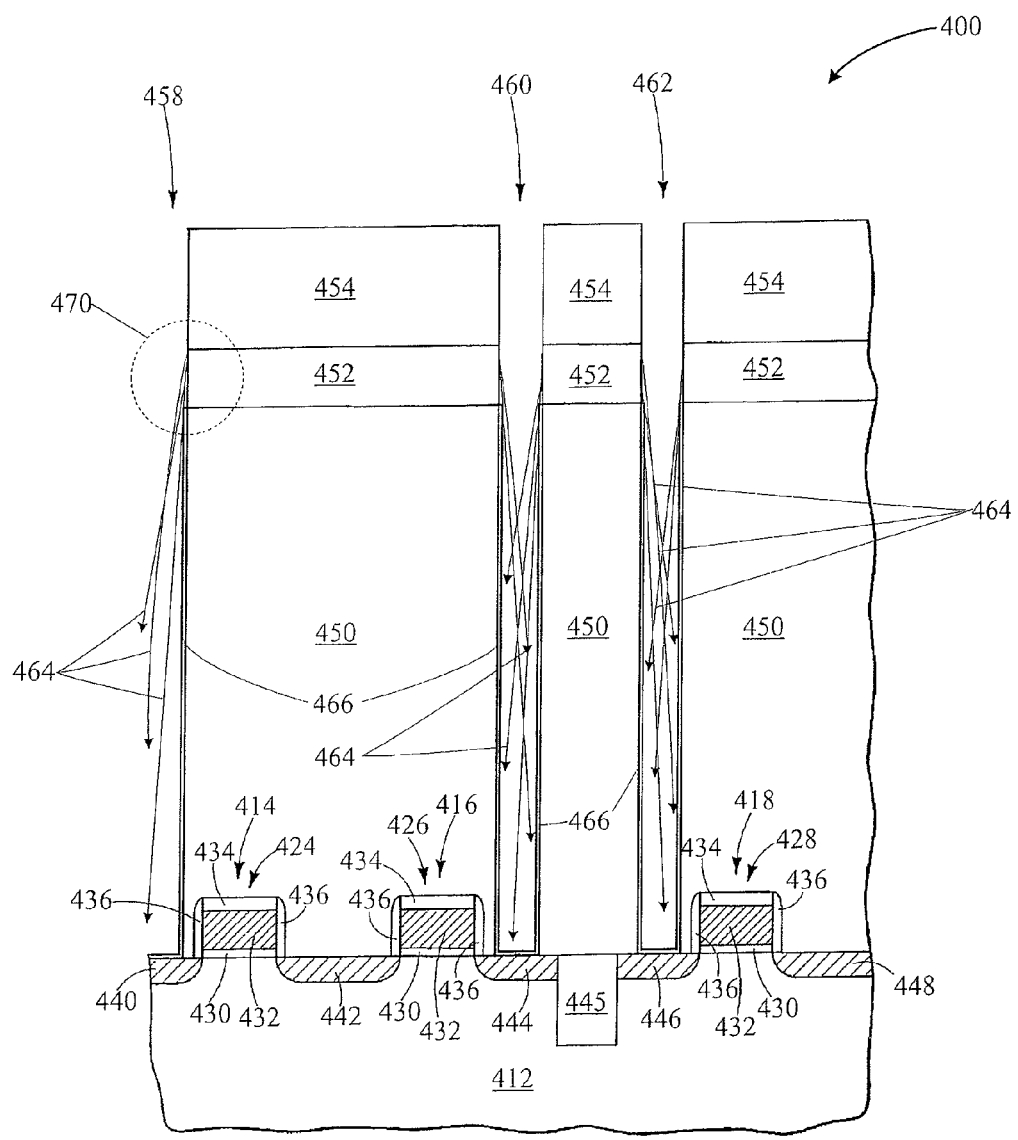
FIG. 11 is an expanded cross-sectional view of the integrated circuit shown in FIG. 8 at a successive processing stage in accordance with the present invention.

FIG. 11 illustrates an enlarged cross-sectional view of the integrated circuit device 400 as shown in FIG. 10 after removing the remaining portions photoresist 456 and portions of the silicon oxide-containing material 450.

Cavities 458, 460, and 462 are extended through the silicon oxide-containing material 450 to source/drain regions 440, 444, and 446, respectively. The cavities 458, 460, and 462 may be extended utilizing substantially the same methods described herein with reference to FIG. 6 when etching the semiconductor substrate 250 and may have some or all of the same characteristics as the cavities 254, 256, and 258 such as, but not limited to, shape, depth, width, aspect ratio, etc. Further, the etching may be conducted in an etch chamber, such as the chamber 300 described herein with reference to FIG. 7.

The process used to extend cavities 458, 460, and 462 into the silicon oxide-containing material 450 may be the same process used to form the cavities through the dissipation material 452 and/or the hard mask 454. Alternatively, the process used to remove material in each of the hard mask 454, dissipation material 452, and silicon-oxide containing material 450 may be a separate and distinct process. In still another alternative, the processes used to remove the hard mask 454 and extend the cavities 458, 460 and 462 into the silicon-oxide containing material 450 may be the same, while the process used to remove the intervening dissipation material may be different.

As discussed herein, etching cavities into the silicon-oxide containing material 450 may cause excessive electric charges to build-up along the surfaces of the cavities. Those charges can result in twisting, etc. of the cavities. To address the charge build-up, portions of the dissipation material 452 may be dislodged and sputtered down into the cavities 458, 460, and 462 as part of the process of forming the cavities. The dislodged portions 464 (represented by the arrows 464 in FIG. 11) of the dissipation material 452 may be transferred to the interior surfaces (e.g., sidewall(s), bottom, etc.) of the cavities 458, 460, and 462. The arrows representing the trajectories of dislodged portions 464 in FIG. 11 are only some potential trajectories of the dislodged portions 464. The dislodged portions 464 may take any trajectory, e.g., straight-line, parabolic, sinusoidal, random, spiral, etc.

The dislodged portions 464 of the dissipation material 452 may form as transferred dissipation material 466 along the interior surfaces of the cavities 458, 460, and 462. The transferred dissipation material 466 may cover the entirety of the interior surface on which it is located (e.g., sidewall, bottom, etc.) or it may cover only a portion or portions of various interior surfaces. Further, the transferred dissipation material 466 may have a uniform or variable thickness on the various interior surfaces. For example, the transferred dissipation material 466 may be about 1 angstrom to about 10 angstroms thick. The transferred dissipation material 466 may extend to the bottom of the cavities 458, 460, and 462 or the transferred dissipation material 466 may extend only partially down the depth of the cavities 458, 460, and 462.

In one embodiment, the dislodged portions 464 may be dislodged from the dissipation material 452 by the same process used to form the cavities 458, 460, and 462 through the dissipation material 452 as described herein with reference to FIG. 10. In another embodiment, the portions 464 may be dislodged from the dissipation material 452 by the same process used to extend the cavities 458, 460, and 462 into the silicon oxide-containing substrate 450 as described herein with reference to FIG. 11. Other variations may also be possible. In some instances, it may be preferred that a single continuous process may be used to both form the cavities through the dissipation material 452 and extend the cavities 458, 460, and 462 into the silicon oxide-containing substrate 450, while, in other embodiments, the processes used to form the cavities in the dissipation material 452 and extend the cavities into the silicon-oxide containing material 450 may be different.

The dissipation material 452 may contain conductive material as described herein with reference to dissipation material 252 of FIG. 4. As such, the portions of the dissipation material 452 that are transferred into the cavities 458, 460, and 462 to form transferred dissipation material 466 may include conductive material that may form conductive paths for charge dissipation as described herein with reference to transferred dissipation material 260 of FIG. 6.

Although the cavities 458, 460, and 462 in FIG. 11 are shown extending to the source/drain regions 440, 444, and 446, respectively, it is to be understood that, in other embodiments, conductive pedestals could be formed on the source/drain regions 440, 444, and 446, and the etch could then be conducted to extend to upper surfaces of such conductive pedestals.

Figure 12:
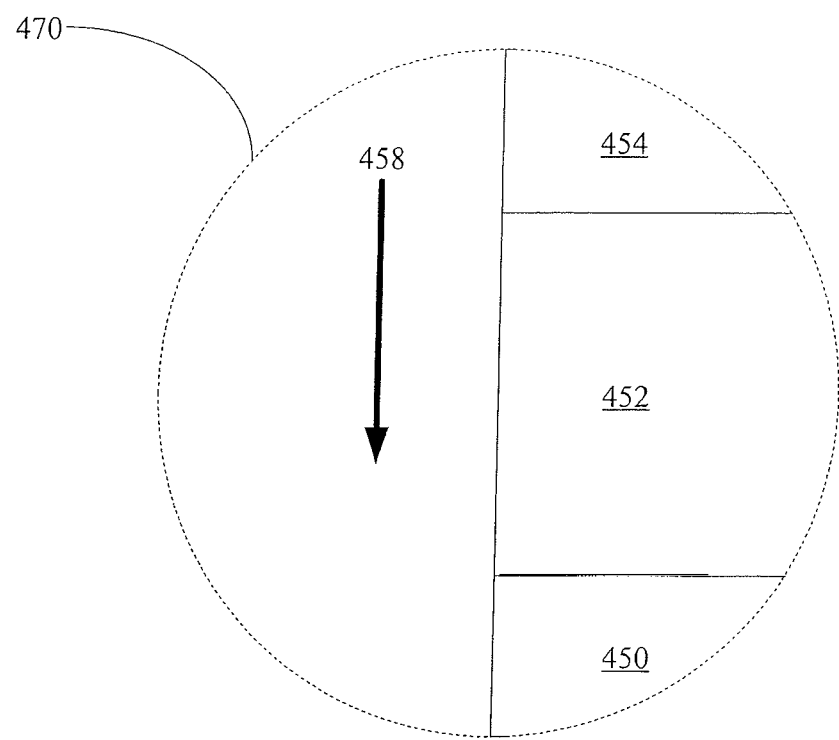
FIG. 12 is an enlarged, expanded cross-sectional view of the integrated circuit shown in FIG. 11 at a successive processing stage in accordance with the present invention.
Figure 13:
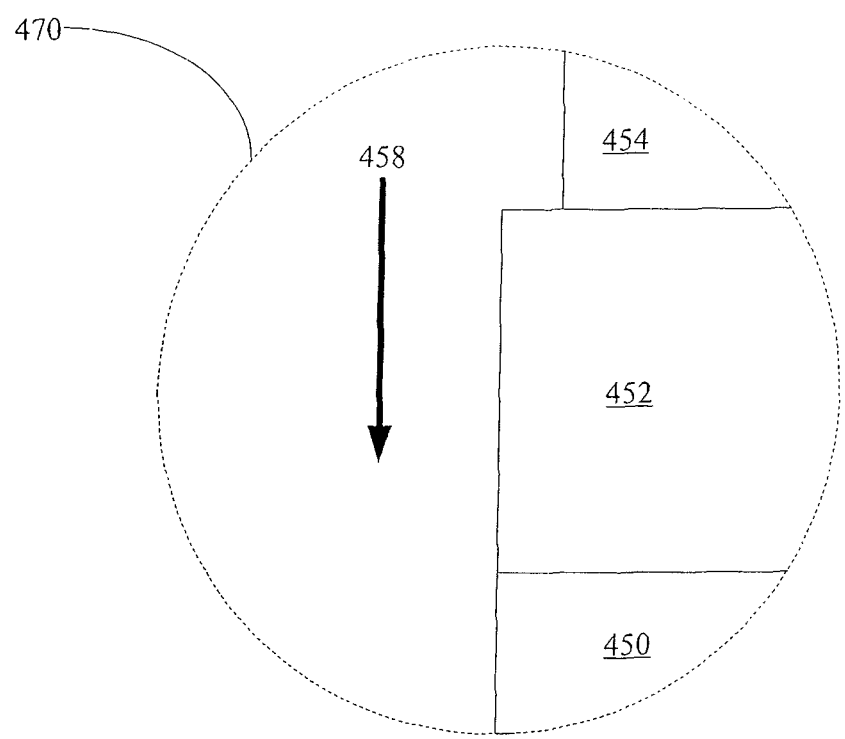
FIG. 13 is another enlarged, expanded cross-sectional view of an integrated circuit shown in FIG. 11 at a successive processing stage in accordance with the present invention.
Figure 14:
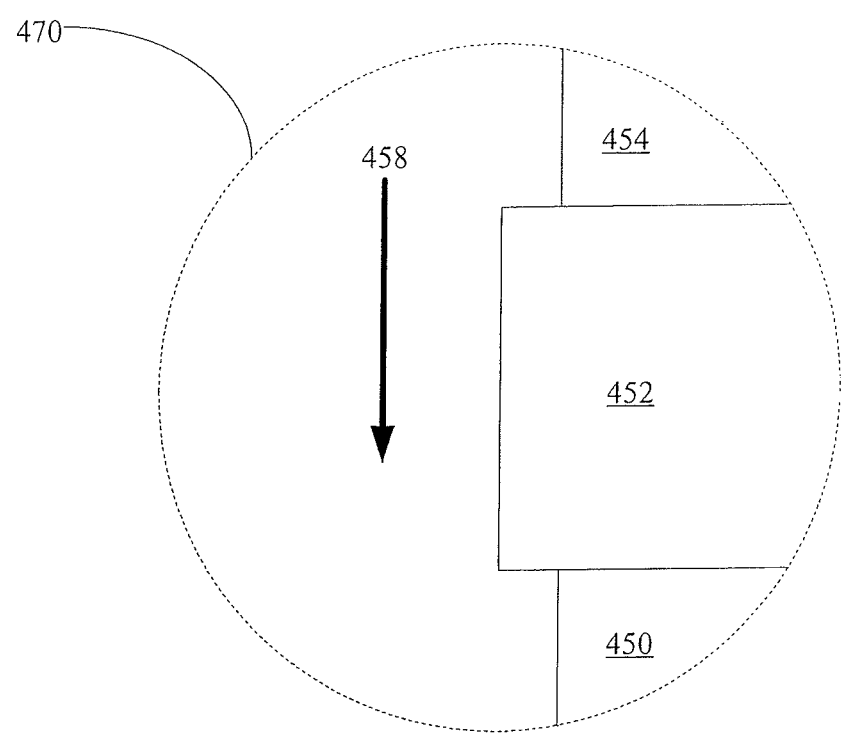
FIG. 14 is yet another enlarged, expanded cross-sectional view of an integrated circuit shown in FIG. 11 at a successive processing stage in accordance with the present invention.

FIGS. 12, 13, and 14 are enlarged views of the identified cross-sectional portion 470 of the integrated circuit device 400 of FIG. 11, which includes hard mask 454, dissipation material 452, and the silicon oxide-containing material 450. These figures will be used to discuss various approaches that may potentially be used to enhance the deposit of dissipation material along the interior cavity surfaces.

FIG. 12 depicts an embodiment in which the materials 450, 452, and 454 are substantially flush along a sidewall of cavity 458. In contrast, FIG. 13 depicts an embodiment in which the dissipation material 452 and the silicon oxide-containing material 450 are substantially flush along the sidewall of cavity 458, while hard mask 454 is partially removed as to expose a portion of the dissipation material 452 at the junction between the hard mask 454 and the dissipation material 452. The hard mask 454 may, e.g., be removed to expose about 10 angstroms to about 50 angstroms of the dissipation material 452 at the sidewall of cavity 458.

FIG. 14 depicts an embodiment in which the hard mask 454 and the silicon oxide-containing material 450 are both partially removed as to expose a portion of the dissipation material 452 at the junction between the dissipation material 452 and the hard mask 454, as well as at the junction between the dissipation material 452 and the silicon oxide-containing material 450. As a result, the exposed portion of dissipation material 452 protrudes into the cavity 458. The silicon oxide-containing material 450 and the hard mask 454 may, e.g., be removed to expose about 10 angstroms to about 30 angstroms of the dissipation material 452 at the sidewall of the cavity 458.

The hard mask 454 and/or the silicon oxide-containing material 450 may be removed to expose the dissipation material 452 through the use of any suitable removal process (e.g., an etch) as would be known by one skilled in the art. For example, either or both of hard mask 454 and silicon oxide-containing material 450 may be removed using an isotropic etch such as a lower power, high pressure $CF_4$, $O_2$, and Ar etch.

Although the arrangement in FIG. 11 may allow portions of the dissipation material 452 to become dislodged and sputtered down the cavity 458 sufficient to dissipate charge build-up, the arrangements depicted in FIGS. 13 and 14 may enhance prevention of charge build-up. This process may be enhanced because more of the dissipation material 452 may be exposed to the bombardment of the reactive ions that may result in more of the conductive material of the dissipation material 452 transferred to the interior surfaces of the cavity, which may provide better charge dissipation. Also, the process may potentially allow more control over the amount of conductive material of the dissipation material 452 to be dislodged, sputtered, and transferred.

The complete disclosure of the patents, patent documents, and publications cited in herein are incorporated by reference in their entirety as if each were individually incorporated.

Exemplary embodiments of the present invention are described above. Those skilled in the art will recognize that many embodiments are possible within the scope of the invention. Other variations, modifications, and combinations of the various components and methods described herein can certainly be made and still fall within the scope of the invention. Thus, the invention is limited only by the following claims and equivalents thereto.

The invention claimed is:

1. A method of fabricating a cavity that extends into a semiconductor substrate, comprising:
   providing a semiconductor substrate that includes a silicon oxide-containing material over a base semiconductor material;
   depositing a metallic dissipation layer over an upper surface of the silicon oxide-containing material; the metallic dissipation layer being composed of a dissipation material;
   forming a hard mask over the metallic dissipation layer;
   etching through the hard mask, through the metallic dissipation layer and into the silicon oxide-containing material to form a cavity that extends into the silicon oxide-containing material; a portion of the dissipation material being dislodged and sputtered into the cavity during the etching; the dissipation material sputtered into the cavity forming conductive paths to dissipate electrical charge in the cavity; and
   prior to sputtering at least some of said portion of the dissipation material into the cavity, recessing the hard mask relative to the metallic dissipation layer to leave an exposed ledge of the metallic dissipation layer.

2. The method of claim 1 wherein the dissipation material comprises one or both of gold and platinum.

3. The method of claim 1 wherein the dissipation material comprises gold.

4. The method of claim 1 wherein the dissipation material comprises platinum.

5. The method of claim 1 wherein the recessing also comprises recessing the silicon oxide-containing material relative to the metallic dissipation layer to leave the exposed ledge of the metallic dissipation layer protruding into the cavity inward of a sidewall along the silicon oxide-containing material.

* * * * *